(12) United States Patent
Sezi et al.

(10) Patent No.: US 8,258,633 B2
(45) Date of Patent: Sep. 4, 2012

(54) SEMICONDUCTOR PACKAGE AND MULTICHIP ARRANGEMENT HAVING A POLYMER LAYER AND AN ENCAPSULANT

(75) Inventors: Recai Sezi, Roettenbach (DE); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 149 days.

(21) Appl. No.: 12/750,969

(22) Filed: Mar. 31, 2010

(65) Prior Publication Data
US 2011/0241222 A1 Oct. 6, 2011

(51) Int. Cl.
*H01L 23/498* (2006.01)
*H01L 21/56* (2006.01)
*H01L 23/28* (2006.01)

(52) U.S. Cl. ......... 257/782; 257/E23.068; 257/E21.502; 257/E23.116; 257/737; 257/738; 257/734; 257/778

(58) Field of Classification Search ................ 257/782, 257/787, E21.502, E23.068, E23.116, 737, 257/738, 734.778
See application file for complete search history.

(56) References Cited

U.S. PATENT DOCUMENTS

| | | | |
|---|---|---|---|
| 5,497,033 A | 3/1996 | Fillion et al. | |
| 6,845,554 B2 | 1/2005 | Frankowsky et al. | |
| 7,662,667 B2 * | 2/2010 | Shen | 438/112 |
| 7,915,690 B2 * | 3/2011 | Shen | 257/390 |
| 8,003,515 B2 * | 8/2011 | Meyer et al. | 438/622 |
| 8,012,807 B2 * | 9/2011 | Meyer et al. | 438/114 |
| 8,034,661 B2 * | 10/2011 | Lin et al. | 438/108 |
| 2002/0004288 A1 | 1/2002 | Nishiyama | |
| 2008/0164599 A1 | 7/2008 | Brunnbauer et al. | |
| 2010/0013091 A1 * | 1/2010 | Meyer et al. | 257/737 |
| 2010/0073663 A1 * | 3/2010 | Meyer | 355/77 |
| 2010/0233831 A1 * | 9/2010 | Pohl et al. | 438/15 |
| 2010/0237506 A1 * | 9/2010 | Brunnbauer et al. | 257/773 |
| 2010/0320588 A1 * | 12/2010 | Dahilig et al. | 257/690 |
| 2011/0204513 A1 * | 8/2011 | Meyer et al. | 257/738 |
| 2012/0001325 A1 * | 1/2012 | Lin et al. | 257/737 |
| 2012/0038043 A1 * | 2/2012 | Jin | 257/737 |

FOREIGN PATENT DOCUMENTS
DE 101 57 280 A1 6/2003
* cited by examiner

*Primary Examiner* — A O Williams
(74) *Attorney, Agent, or Firm* — Slater & Matsil, L.L.P.

(57) ABSTRACT

A polymer layer is generated on a wafer. The wafer is then separated into semiconductor chips. At least two semiconductor chips are placed on a carrier with the polymer layer facing the carrier. The at least two semiconductor chips are covered with an encapsulating material to form an encapsulant. The carrier is removed from the encapsulant, and the encapsulant and the polymer layer are thinned.

19 Claims, 7 Drawing Sheets

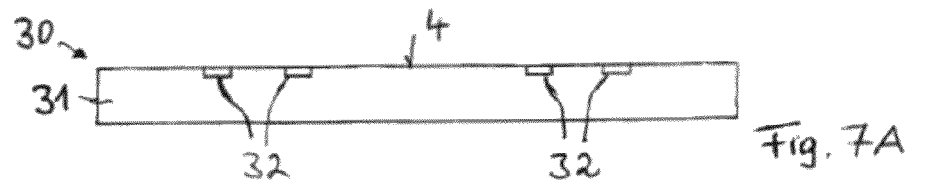
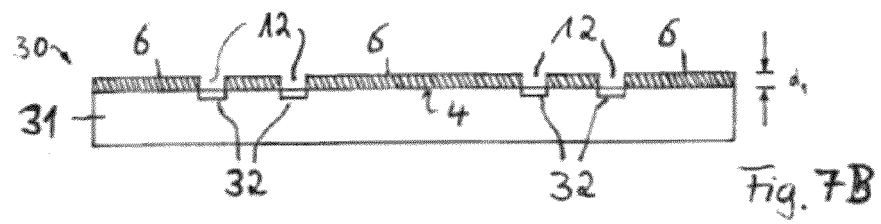
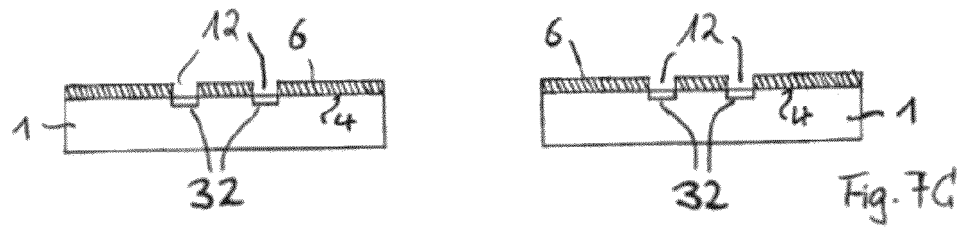
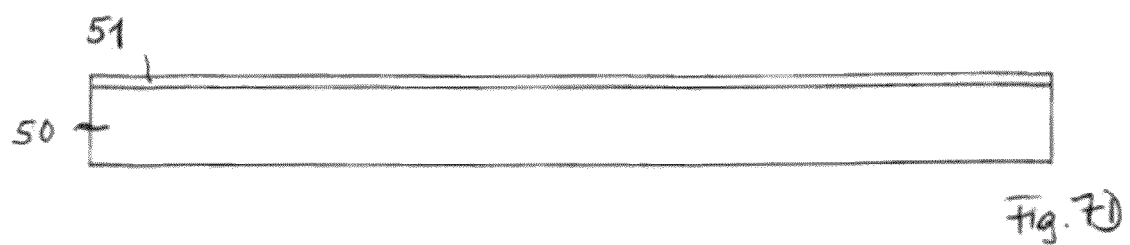
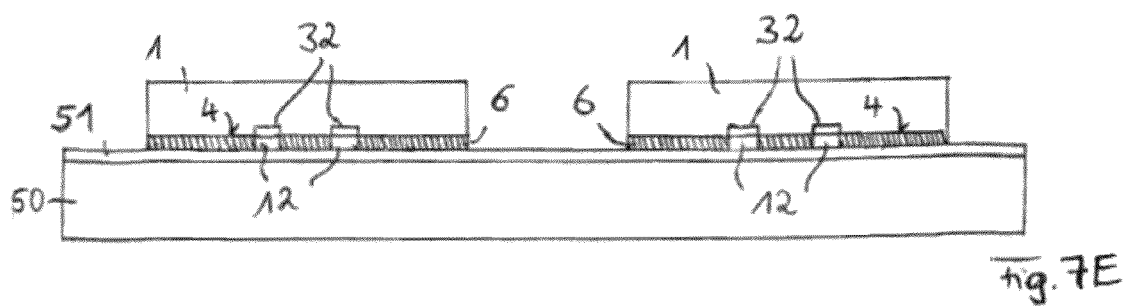

US 8,258,633 B2

SEMICONDUCTOR PACKAGE AND MULTICHIP ARRANGEMENT HAVING A POLYMER LAYER AND AN ENCAPSULANT

TECHNICAL FIELD

The present invention generally relates to semiconductor packaging, and more particularly to a method of manufacturing a semiconductor package.

BACKGROUND

Semiconductor chips may be packaged. Semiconductor devices may be fabricated by separating single dies from a wafer, rearranging them on a carrier and packaging them in plastics. Cost efficient packages and methods of packaging are highly desired in the art. To this end, manufacturing methods providing high yield at low expense are desirable.

SUMMARY OF THE INVENTION

In one embodiment, a polymer layer is generated on a wafer. The wafer is then separated into semiconductor chips. At least two semiconductor chips are placed on a carrier with the polymer layer facing the carrier. The at least two semiconductor chips are covered with an encapsulating material to form an encapsulant. The carrier is removed from the encapsulant, and the encapsulant and the polymer layer are thinned.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts;

FIGS. 7A to 7K schematically illustrate one embodiment of a method to produce a semiconductor device 300.

DETAILED DESCRIPTION OF ILLUSTRATIVE EMBODIMENTS

Figure 1:
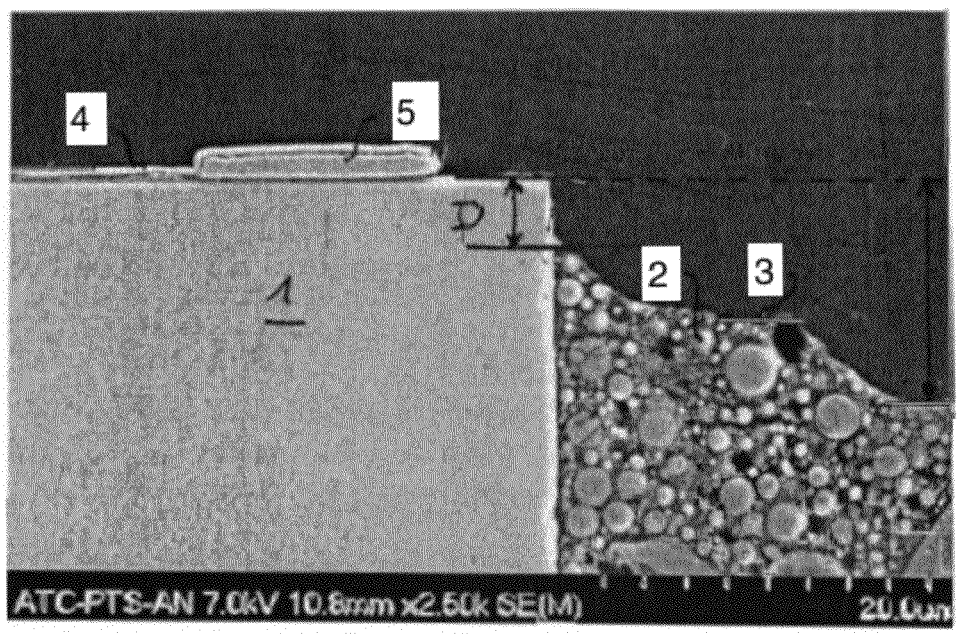
FIG. 1 is a cross-sectional image of a semiconductor chip embedded in an encapsulant obtained by an electron microscope.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing semiconductor chips are described below. The semiconductor chips may be of different types, may be manufactured by different technologies and may include for example, integrated electrical, electro-optical or electro-mechanical circuits and/or passive devices. The semiconductor chips may, for example, be designed as logic integrated circuits, analog integrated circuits, mixed signal integrated circuits, power integrated circuits, memory circuits or integrated passive devices. They may include control circuits, microprocessors or microelectromechanical components. Further, they may be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements, in particular, on its two main faces, that is to say on its top side and bottom side. In particular, power semiconductor chips may have a vertical structure. By way of example, the source electrode and gate electrode of a power MOSFET may be situated on one main face, while the drain electrode of the power MOSFET is arranged on the other main face. Furthermore, the devices described below may include integrated circuits to control the integrated circuits of other semiconductor chips, for example, the integrated circuits of power semiconductor chips. The semiconductor chips need not be manufactured from specific semiconductor material, for example, Si, SiC, SiGe, GaAs, AlGaAs and, furthermore, may contain inorganic and/or organic materials that are not semiconductors, such as, for example, insulators, plastics or metals.

The devices described below include external contact elements or external contact pads on a package. The external contact pads may represent the external terminals of the semiconductor package. They may be accessible from outside the package and may thus allow electrical contact to be made with the semiconductor chip(s) from outside the package. Furthermore, the external contact pads may be thermally conductive and may serve as heat sinks for dissipating the heat generated by the semiconductor chip or chips embedded in the semiconductor package. The external contact pads may be composed of any desired electrically conductive material, for example, of a metal, such as copper, aluminum or gold, a metal alloy or an electrically conductive organic material.

Solder material, such as solder balls or solder bumps, may be deposited on the external contact pads.

The semiconductor chips or at least parts of the semiconductor chips are covered with an encapsulating material to form an encapsulant (e.g., a molded body), which may be electrically insulating. The encapsulant may be a dielectric material and may be made of any appropriate duroplastic, thermoplastic or thermosetting material or laminate (prepreg). The encapsulant may contain filler materials. After its deposition, the encapsulant may be only partially hardened and may be completely hardened after application of energy (e.g., heat, UV light, etc.) to form an encapsulant. Various techniques may be employed to cover the semiconductor chips with the encapsulant, for example, compression molding, injection molding, powder molding, liquid molding, dispensing or laminating.

The encapsulant may be used to produce so-called fan-out type packages. In a fan-out type package at least some of the external contact pads and/or conductor tracks connecting the semiconductor chip to the external contact pads are located laterally outside of the outline of the semiconductor chip or at least intersect the outline of the semiconductor chip. Thus, in fan-out type packages, a peripherally outer part of the package of the semiconductor chip is typically (additionally) used for electrically bonding the package to external applications, such as, e.g., application boards or, in stacked package applications, another package. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

The semiconductor chip is provided with a polymer layer. The polymer layer may be applied during wafer level processing, that is during frontend processing. By way of example, the polymer layer may be applied by a CVD (Chemical Vapor Deposition) process or by a spin coating process. The polymer layer may be made of a photoresist or of any other etching resist. In particular, filler materials such as, e.g., organic or mineral filler materials may be included in the polymer layer. The filler material may improve the CTE (coefficient of thermal expansion) to decrease stress and warpage of the package and may improve the protective effect of the polymer layer to the semiconductor chip surface covered by the polymer layer.

A surface of the polymer layer is thinned. In many cases, a surface formed by the encapsulant and the polymer layer is thinned. Grinding or lapping machines may be used that are similar or identical to the machines used for semiconductor wafer grinding or lapping in frontend technology.

One or more conductive layers, e.g., metal layers, may be placed over the encapsulant and the polymer layer overlying the semiconductor chip. The conductive layers may, for example, be used to produce a redistribution layer within a conductive redistribution structure. The conductive layers may be used as wiring layers to make electrical contact with the semiconductor chips from outside the package and/or to make electrical contact with other semiconductor chips and/or components contained in the package. The conductive layers may be manufactured with any desired geometric shape and any desired material composition. The conductive layers may, for example, be composed of conductor tracks, but may also be in the form of a layer covering an area. They may be used to provide the external contact pads of the package. Any desired metal, for example, aluminum, nickel, palladium, silver, tin, gold or copper, or metal alloys may be used as the material. The conductive layers need not be homogenous or manufactured from just one material, that is to say various compositions and concentrations of the materials contained in the conductive layers are possible. Thin-film technologies may be applied to generate and/or structure the conductive layers.

The conductive layers may be arranged above or below or between electrically insulating layers forming part of the conductive redistribution structure. An insulating layer overlaying a conductive layer may be used as a solder stop layer.

FIG. 1 is a sectional image of a semiconductor chip 1 embedded in an encapsulant 2. The pitch of the scale in (horizontal) x direction is 2.0 µm As is apparent in FIG. 1, the semiconductor chip 1 projects over a surface 3 of the encapsulant 2, in which the semiconductor chip 1 is embedded. Typically, the stand-off D, that is the distance between a surface 4 of the semiconductor chip 1 and the surface 3 of the encapsulant 2 at the edge of the semiconductor chip 1 amounts to a number of micrometers, in this example about 3.5 µm. Further, the surface 3 of the encapsulant 2 shows variations in height of a few micrometers. Still further, the surface 3 of the encapsulant 2 may be covered by an intermixing layer caused by residual material of an adhesive tape, and the surface 4 of the semiconductor chip 1 may be polluted by impurities 5 caused by preceding processing steps.

Such stand-off D and level variations map into one or more layers deposited over the semiconductor chip 1 and the encapsulant 2. Typically, a redistribution layer structure (RDL, not shown in FIG. 1) including one or more structured conductive layers separated by polymer layers and interconnected by vias is formed over the semiconductor chip 1 and the encapsulant 2. The quality, functionality and the production yield of manufacturing the RDL structure may be significantly impaired by the stand-off D and level variations illustrated in FIG. 1.

FIGS. 2A to 2F schematically illustrate one embodiment of a method to produce a semiconductor device 100. A polymer layer 6 is provided over a semiconductor chip 1. The polymer layer 6 may be made of an etch resist and/or an epoxy-based material. By way of example, the polymer layer 6 may be made of a photoresist such as, e.g., SU8, which is epoxy-based. As noted above, the polymer layer 6 may include a filler material. More specifically, the material of the polymer layer 6 may be electrically insulating and/or photosensitive and/or filled by a filler material and may, for example, contain polyimide, silicone, epoxy, polyurethane, acrylonitrile butadiene styrene (ABS), polybenzoxazole, benzocyclobutene (BCB), polynorbornene, phenolic resins, cyclic olefinic (co) polymers, aromatic hydrocarbons, parylene, photoresist material, duroplast, silicon nitride or an inorganic, ceramic-like material, such as silicone-carbon compounds, polyphenylenebenzobisoxazole (PBS) or other appropriate materials. The material may be entirely made of one or more of the aforementioned materials or may be made of a combination of one or more of these materials and other materials. The polymer layer 6 may be a photosensitive dielectric (such as polyimide, polybenzoxazole, BCB, epoxy, etc.), as well.

The polymer layer 6 may be applied by CVD, spin-on processes, spray deposition, printing, dispensing or any other suitable process to generate a polymer layer 6 over a semiconductor chip surface 4. The polymer layer 6 may be deposited directly on the chip surface 4, either directly on the bare semiconductor material surface or on a hard passivation layer (e.g., oxide or nitride layer, not shown) covering the semiconductor material surface.

Figure 2A:
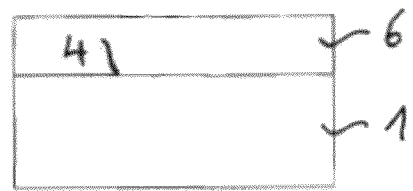
FIGS. 2A to 2F schematically illustrate one embodiment of a method to produce a semiconductor device.

Typically, the polymer layer 6 is generated during wafer level processing, that is the layer 6 is deposited on the intact, non-separated wafer (not shown in FIG. 2A). After dicing the wafer and thereby separating the individual semiconductor chips 1, each semiconductor chip 1 has a polymer layer 6 as shown in FIG. 2A.

Figure 2B:
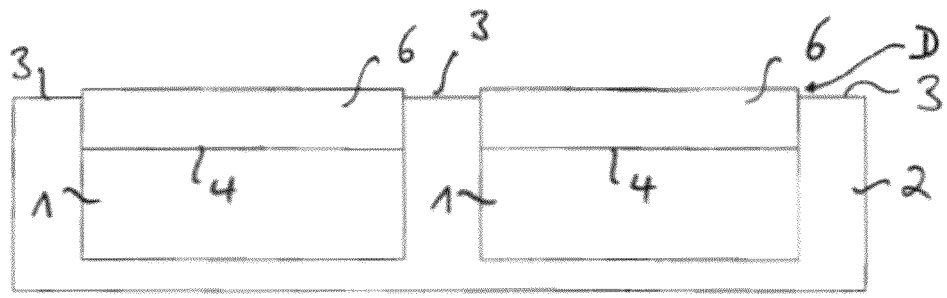

In FIG. 2B, two semiconductor chips 1 are encapsulated in an encapsulant 2. Typically, tens or hundreds of semiconductor chips 1 are embedded in the encapsulant 2, which is sometimes also referred to in the art as an "artificial wafer" or a "molded reconfigured wafer". Embodiments of methods to produce the encapsulant 2 embedding the semiconductor chips 1 will be described in greater detail further below.

As is apparent in FIG. 2B and has already been demonstrated in FIG. 1 in relation to the surface 4 of the semiconductor chip 1, the encapsulation process (which will be explained in more detail further below) may result in that the polymer layer 6 on the semiconductor chips 1 may protrude a certain distance D over the surface 3 of the encapsulant 2. The distance D may be more than one or a few micrometers and may be of similar height as the stand-off D illustrated in FIG. 1. Further, as has also been described in conjunction with FIG. 1, the surface 3 of the encapsulant 2 may feature level variations (not shown in FIG. 2B) or may be covered by residual materials, intermixing layers or impurities as explained in conjunction with FIG. 1.

Figure 2C:
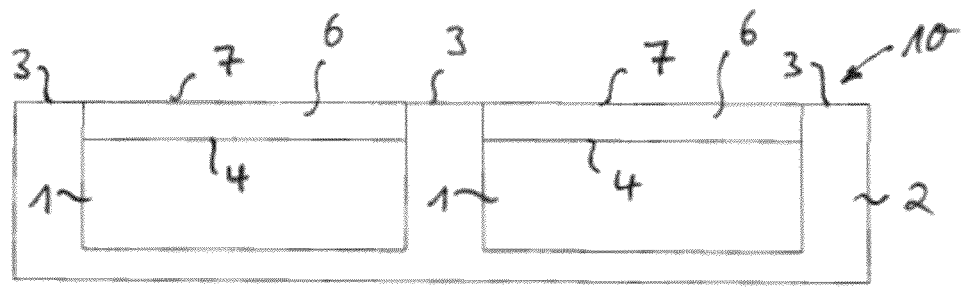

The polymer layer 6 is then thinned. As a result of the thinning, a surface 7 of the polymer layer 6 facing away from the semiconductor chip 1 is flush with the surface 3 of the encapsulant 2 to provide for a common planar surface 10 (FIG. 2C). Typically, especially if the surface 3 of the encapsulant 2 shows significant level variations, the polymer layer 6 and the encapsulant 2 are thinned simultaneously to provide for the common planar surface 10. By way of example, a high evenness with maximum step-like height variations of the common planar surface 10 of less than 1000 nm, 500 nm, 300 nm, 200 nm or 100 nm over the extension of one package 100 or even over the extension of the entire "molded reconfigured wafer" may be obtained. Here, a "step-like height variation" means the maximum height variation measured over say a range of about 100 μm in x direction. Further, any possible remainders and impurities (e.g., the intermixing layer remainders of an adhesive tape) are completely removed. As a result, all subsequent processing steps may be accomplished with enhanced quality, accuracy and yield. Further, as all intermixing layer remainders are removed by the thinning, even tapes leaving such remainders (even cured remainders) on the surface 3 of the encapsulant 2 may nevertheless be used. This facilitates the selection of suitable tapes and peel off procedures.

Thinning may be accomplished, e.g., by grinding or lapping. Grinding or lapping machines may be used that are similar or identical to the machines used for semiconductor wafer grinding or lapping in frontend technology. Whilst grinding tools use an abrasive wheel, lapping tools use a fluid ("slurry") charged with "rolling" abrasive particles acting between two surfaces. For instance, CMP (chemical mechanical polishing) may be applied. Thinning of the polymer layer 6 is continued until at least the surface 3 of the encapsulant 2 is reached, i.e., the stand-off D is eliminated. Optionally, the surface 3 of the encapsulant 2 is also thinned or polished in order to fully level the entire common planar surface 10.

Figure 2D:
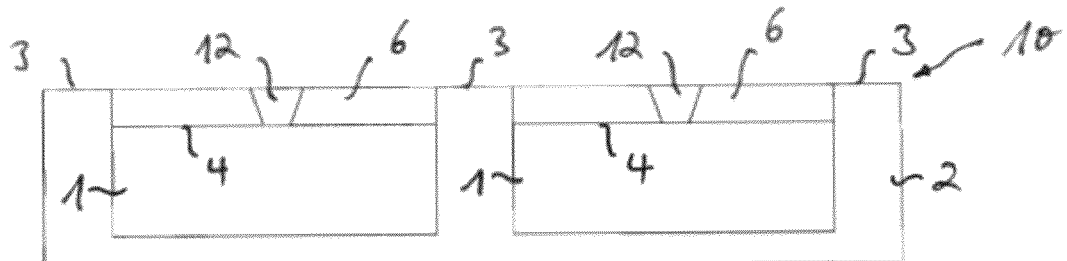

The polymer layer 6 may then be structured, that is a plurality of recesses 12 (vias or cutouts or through-holes or trenches) are created in the polymer layer 6 to expose at least portions of a surface extending beneath the polymer layer 6 (FIG. 2D). The recesses 12 may be vias to expose, e.g., contact pads (not shown) of the semiconductor chip 1 extending under the recesses 12. In several embodiments, the recesses 12 may be openings to expose optical or mechanical active structures integrated in the semiconductor chip 1. By way of example, such openings may be used as light inlets/outlets or venting holes if the semiconductor chip 1 is a light detector/emitter or a pressure sensor, respectively.

Figure 2E:
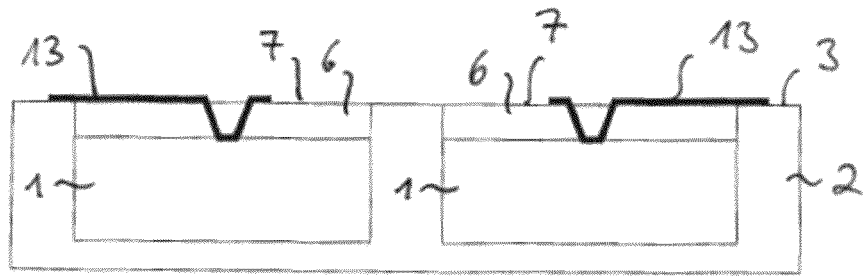

After the structuring of the polymer layer 6, a conductive layer 13 may optionally be applied (FIG. 2E). The conductive layer 13 extends over the (thinned or polished) surface 7 of the polymer layer 6 and, optionally, over the (thinned or polished) surface 3 of the encapsulant 2. The conductive layer 13 may be deposited directly onto these surfaces 7 and 3, without any intermediate layer in between. The conductive layer 13 may consist of a seed layer (not shown) and a further layer which is galvanically deposited ("plated") onto the seed layer. This process is described in detail in conjunction with FIG. 7H further below. As an alternative to the galvanic plating process referred to above, an electroless plating process such as electroless nickel-palladium plating may be used. Electroless plating is also referred to as chemical plating in the art. Further, other deposition methods such as physical vapor deposition (PVD), chemical vapor deposition (CVD), sputtering, spin-on processes, spray deposition or ink jet printing may be employed to form the conductive layer 13. By way of example, the conductive layer 13 may also be created by depositing a paste containing fine metal particles, possibly after application of a seed layer. The metal particles may, for example, be made of copper, silver, gold, tin or nickel or a metal alloy. The metal particles may be dispersed in a suitable liquid or solvent. The application of the paste containing the metal particles dispersed in the liquid may be performed, e.g., by stencil printing, screen printing, ink jet printing or other suitable printing technologies. The conductive layer 13 is a patterned layer, wherein patterning may be performed during deposition of the paste. After the application of the paste, the paste may be exposed to an energy (e.g., elevated temperature, etc). This temperature step causes the liquid in the paste to evaporate. Furthermore, the applied temperature may be lower than the melting temperature of the metal (when provided in macroscopic dimensions) of which the metal particles are made. Due to the temperature step, the metal particles may sinter and may thus form a solid metal conductive layer 13. If a seed layer was applied prior to application of the metal particles it is removed by suitable process steps, using the possibly sintered metal particles as a mask for the seed layer.

Figure 2F:
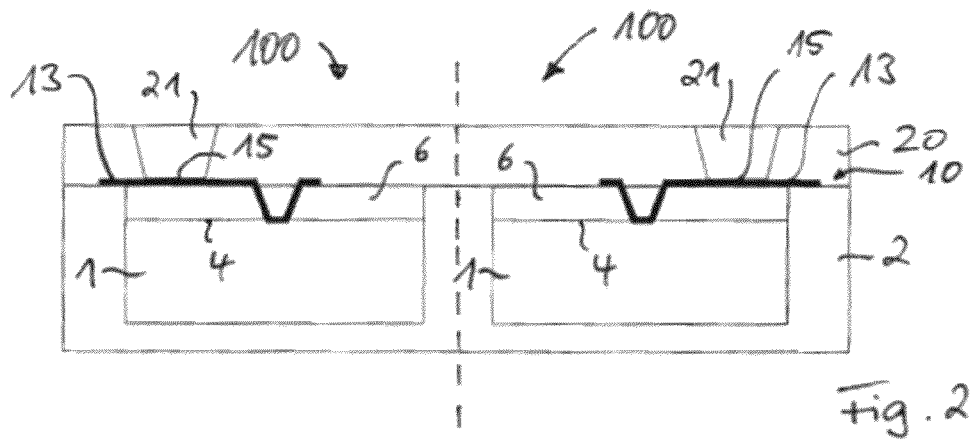

A dielectric layer 20 may be deposited on top of the conductive layer 13 and over the common planar surface 10 (FIG. 2F). The dielectric layer 20 may be fabricated in various ways. For example, the dielectric layer 20 may be deposited from a gas phase or from a solution, or can be printed or laminated onto the common planar surface 10. Furthermore, thin-film technology methods or a standard PCB industry process flow can be used for the application of the dielectric layer 20. The dielectric layer 20 may be fabricated from a polymer, such as parylene, photoresist material, imide, epoxy, duroplast, silicone, silicon nitride or an inorganic, ceramic-like material, such as silicone-carbon compounds. The thickness of the dielectric layer 20 may be up to 10 μm or even higher. The dielectric layer 20 may also be omitted.

The dielectric layer 20 may be opened in certain areas to expose portions of the conductive layer 13 as illustrated in FIG. 2F. The openings 21 in the dielectric layer 20 may, for example, be produced by using photolithographic methods, ablation and/or etching methods. The exposed portions of the conductive layer 13 may serve as external contact pads 15. The dielectric layer 20 may thus have the function of a solder stop layer.

The conductive layer 13 and the dielectric layer 20 may form a so-called redistribution structure. The redistribution structure may not only contain one but a plurality of conductive layers separated by a plurality of intermediate polymer layers to implement a multi-layer redistribution structure. Such a redistribution structure may be fabricated by well-known thin-film technology processes and may provide a flexible signal routing and a design of the external contact pads 15 (that is the package terminals) tailored to the customer's needs.

As illustrated in FIG. 2F, semiconductor devices 100 are separated from one another by separation of the encapsulant 2 and possibly the redistribution structure 13, 20, for example, by sawing, cutting, etching or by using a laser beam. A semiconductor device 100 produced that way is depicted in FIG. 5.

Figure 3A:
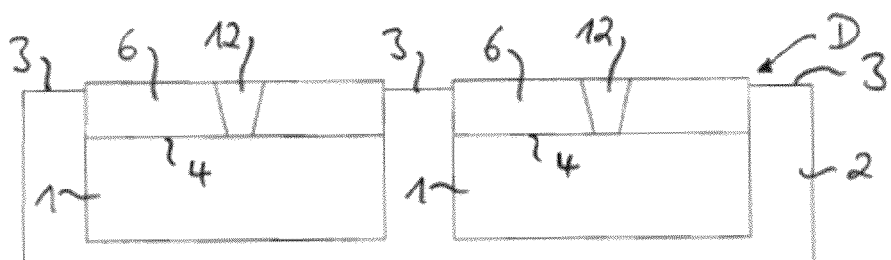
FIGS. 3A to 3B schematically illustrate one embodiment of a method to produce a semiconductor device.
Figure 3B:
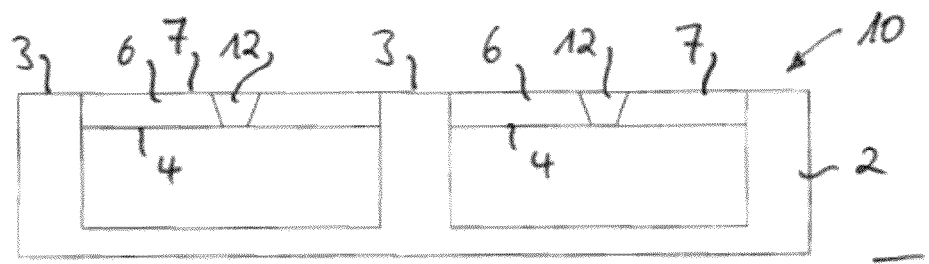
Figure 5:
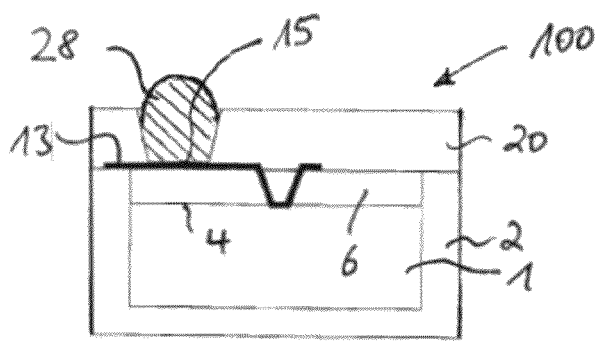
FIG. 5 schematically illustrates one embodiment of a semiconductor device 100.

FIGS. 3A to 3B schematically illustrate method steps of one embodiment of a method to produce a semiconductor structure 100 as shown in FIG. 5 In this embodiment, initial processing steps to produce a semiconductor device 100 may be identical to the steps described above in conjunction with FIGS. 2A to 2B, and reference is made to the corresponding description in order to avoid reiteration.

Referring to the arrangement shown in FIG. 2B, before thinning, the polymer layer 6 may be structured, that is a plurality of recesses 12 (vias or cutouts or through-holes or trenches) are created in the polymer layer 6 to expose at least portions of a surface extending beneath the polymer layer 6 (FIG. 3A). The recesses 12 may be vias to expose, e.g., contact pads (not shown) of the semiconductor chip 1 extending at the bottom of the recesses 12. Concerning the generation of the recesses 12, reference is made to the description above for the sake of brevity.

After the generation of the recesses 12 in the polymer layer 6, the common planar surface 10 is generated by thinning the polymer layer 6 and, optionally, the encapsulant 2 (FIG. 3B). Concerning the thinning, reference is made to the description in conjunction with FIG. 2C in order to avoid reiteration.

After thinning, the arrangement shown in FIG. 3B may be cleaned in order to remove any abrasive particles from the recesses 12 and the common planar surface 10. Subsequent processing steps to obtain a semiconductor device 100 as, by way of example, depicted in FIG. 5 may be identical to the processing steps described above in conjunction with FIGS. 2E, 2F and FIG. 5.

Figure 4A:
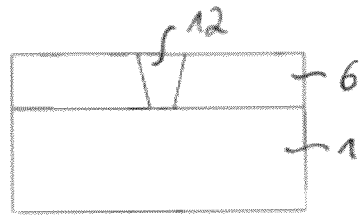
FIGS. 4A to 4B schematically illustrate one embodiment of a method to produce a semiconductor device.
Figure 4B:
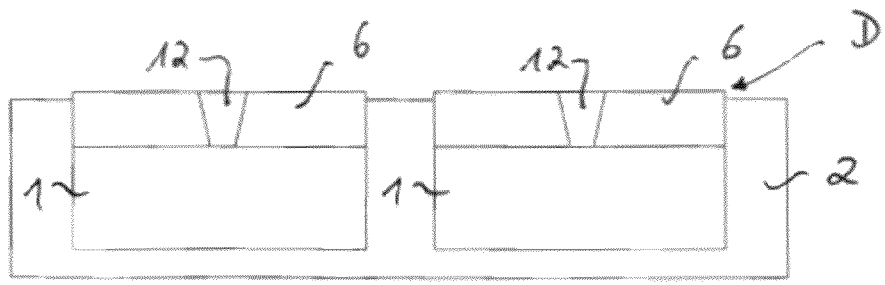

FIGS. 4A to 4B schematically illustrate method steps of one embodiment of a method to produce a semiconductor device 100 as shown in FIG. 5. As has been mentioned above and will be referred to in greater detail further below, typically, the polymer layer 6 is generated during wafer level processing, that is the polymer layer 6 is deposited on the intact, non-separated wafer (not shown). Typically, but not necessarily, the polymer layer 6 is applied over the surface of the wafer at which the active areas or structures of the integrated circuits are formed. In contrast to the embodiments described in conjunction with FIGS. 2A to 2F and 3A to 3B, the polymer layer 6 may be structured on wafer level, that is a plurality of recesses 12 (vias or cutouts or through-holes or trenches) are created in the polymer layer 6 to expose at least portions of a surface extending beneath the polymer layer 6 during wafer level processing. As the recesses 12 are generated during frontend processing, high location accuracy may be obtained. Concerning the generation of the recesses 12, reference is made to the description above for the sake of brevity.

After dicing the wafer and thereby separating the individual semiconductor chips 1, each semiconductor chip 1 has a structured polymer layer 6 as shown in FIG. 4A.

In FIG. 4B, two semiconductor chips 1 having (already) a structured polymer layer 6 are encapsulated in the encapsulant 2. As described with reference to FIG. 2B, typically, tens or hundreds of semiconductor chips 1 are embedded in the encapsulant 2 ("molded reconfigured wafer"). Similar to FIGS. 2B, 3A and FIG. 1, the structured polymer layer 6 on the semiconductor chips 1 may protrude a certain distance D over the surface 3 of the encapsulant 2, and reference is made to the description above in order to avoid reiteration.

Subsequent processing steps to obtain a semiconductor device 100 as, by way of example, depicted in FIG. 5 may be identical to the processing steps described above in conjunction with FIG. 3B (thinning), FIG. 2E (application of one or more conductive layers 13), FIG. 2F (application of one or more dielectric layers 20, structuring the dielectric layer 20, separating the semiconductor devices 100).

The semiconductor device 100 manufactured by the several methods described above may be fan-in type packages as shown in FIG. 5. Further, a solder depot 28 (solder bump, solder ball) may be attached to the contact pad 15. Solder ball attachment may be accomplished before or after separation of the encapsulant 2 into single semiconductor devices 100.

Figure 6:
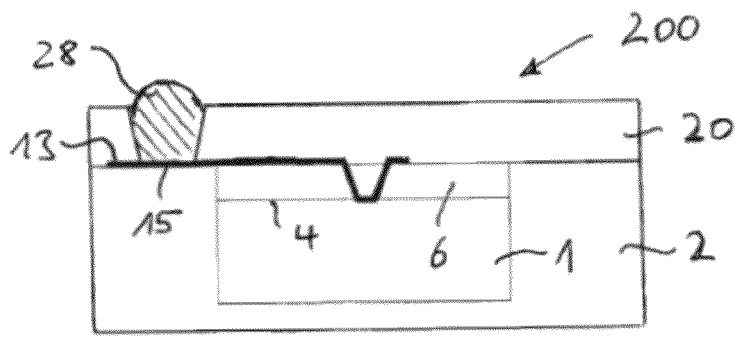
FIG. 6 schematically illustrates one embodiment of a semiconductor device 200.

Further, a semiconductor device 200 shown in FIG. 6 may manufactured by each of the several methods described above. The semiconductor device 200 is a fan-out type package. The encapsulant 2 allows the conductive layer 13 or the entire redistribution structure (here, by way of example, the conductive layer 13 and dielectric layer 20) to extend beyond the outline of the semiconductor chip 1. The external contact pads 15 therefore do not need to be arranged within the outline of the semiconductor chip 1, but can be distributed over a larger area. In many semiconductor chips 1, e.g., logic circuits, a high number of contact pads 15 are necessary. Fan-out type packages such as package 200 provide increased area which is available for the arrangement of the external contact pads 15. As a result, the external contact pads 15 cannot only be arranged at a greater distance from one another, but the maximum number of external contact pads 15 which can be provided is likewise increased compared to the situation when all the external contact pads 15 are arranged fan-in, that is within the outline of the semiconductor chip 1.

A semiconductor device 100, 200 manufactured by the methods described above may have an encapsulant 2 which has further been ground at the backside surface of the encapsulant 2 opposite to the surface 3. A redistribution structure (not shown in FIGS. 5 and 6) may also be applied at this backside surface.

Further, also not illustrated in FIGS. 5, 6, portions of the encapsulant 2 may be removed, for example, in order to create one or more recesses, through-holes or trenches in the encapsulant 2. Removing the encapsulant 2 may be carried out by using a laser beam or a water jet, mechanical sawing using a saw or a cutter, chemical etching, milling or any other appropriate method. In the recesses, through-holes or trenches, electrically conductive material may be deposited, for example, in order to create one or more through-connections. The through-connections may extend from one surface 3 to the opposite (backside) surface of the encapsulant 2. The through-connections are electrically conductive and may electrically couple conductive layer 13 on surface 3 to an electrically conductive layer on backside surface of the encapsulant, that is of the package.

Such recesses, through-holes or trenches may, for example, be filled with a paste containing metal particles. The metal particles may, for example, be made of silver, gold, copper, tin or nickel. The metal particles may be dispersed in a suitable liquid or solvent. After their application, the metal particles may be heated and thereby sintered.

Figure 7F:
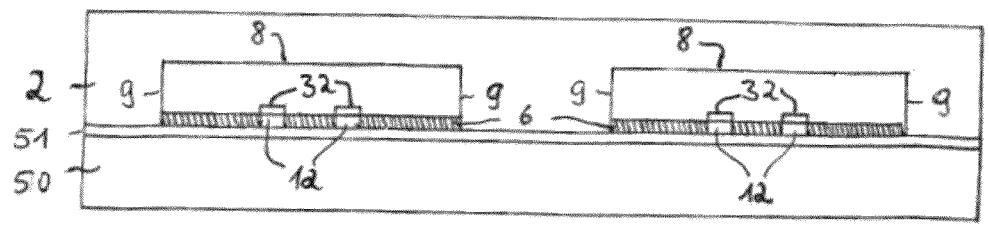
Figure 7G:
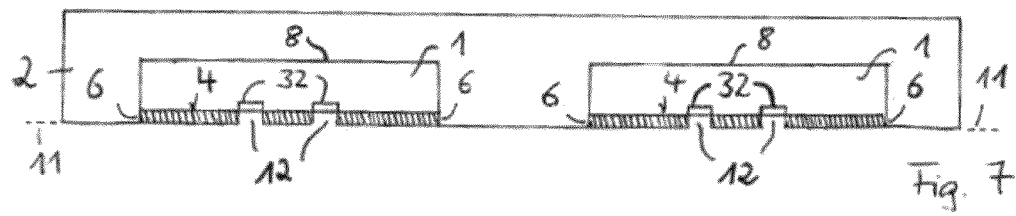
Figure 7H:
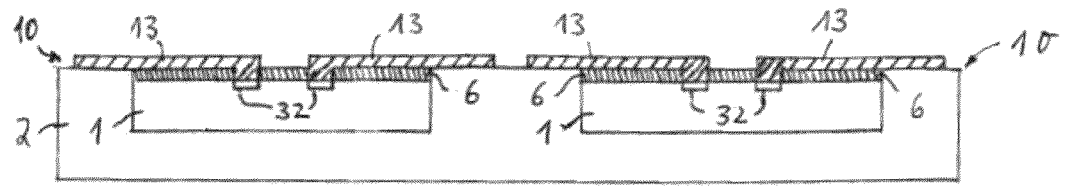
Figure 7I:
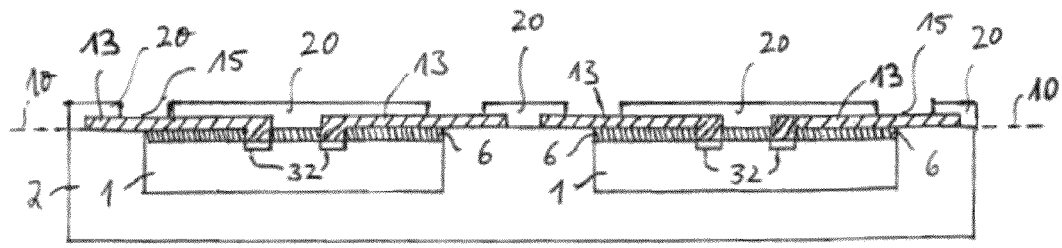
Figure 7J:
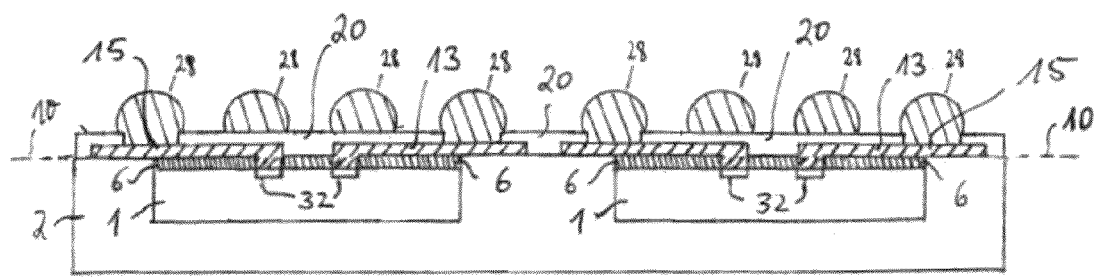
Figure 7K:
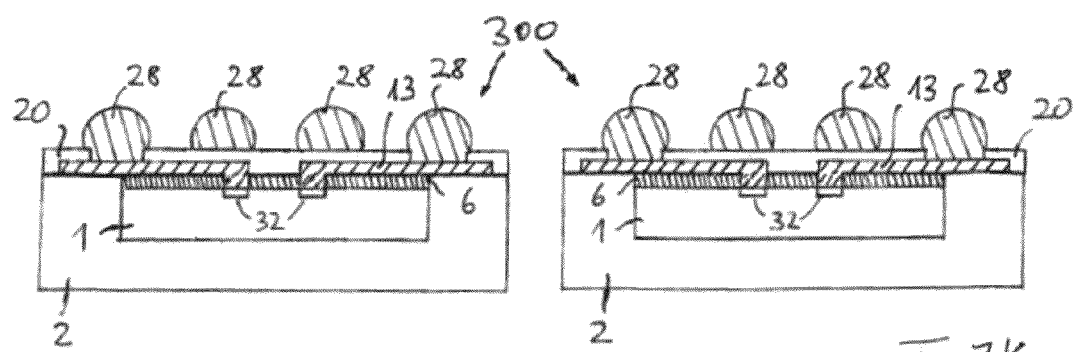

FIGS. 7A to 7K schematically illustrate a method for manufacturing a semiconductor device 300 shown in FIG. 7K. The method illustrated in FIGS. 7A to 7K is an implementation of the methods shown in FIGS. 2A to 2F, 3A to 3B, 4A to 4B. The details of the production method that are described below can therefore be likewise applied to the methods of FIGS. 2A to 2F, 3A to 3B, 4A to 4B. Furthermore, the semiconductor device 300 is an implementation of the semiconductor devices 100, 200. The details of the semiconductor device 300 that are described below can therefore be likewise applied to the semiconductor devices 100, 200.

The semiconductor chips 1 as well as all other semiconductor chips described herein may be fabricated on a wafer 30 made of semiconductor material. Such a semiconductor wafer 30 is illustrated in FIG. 7A. The semiconductor wafer 30 may include a bulk silicon 31 in which integrated circuits are embedded. Chip contact pads 32 are located on a first main face 4 of the semiconductor wafer 30. The integrated circuits can be electrically accessed via the chip contact pads 32. The chip contact pads 32 may be made of a metal, for example, aluminum or copper, and may have any desired shape and size.

The material of the polymer layer 6 may be deposited onto the first face 4 of the semiconductor wafer 30 as illustrated in FIG. 7B. The material may be entirely made of one or more of the aforementioned materials or may be made of a combination of one or more of these materials and other materials. Again, the polymer layer 6 may, inter alia, be a photosensitive dielectric (such as polyimide, polybenzoxazole, BCB, epoxy, etc.), as well.

The material of the polymer layer 6 may be deposited by spin-coating, printing, lamination or any other suitable technique. The thickness $d_1$ of the polymer layer 6 may be in the range from 4 to 50 µm or more, and, in particular, from 5 to 20 µm. In one embodiment, the polymer layer 6 may be a continuous unstructured layer on wafer level. In this case, the processes illustrated in FIGS. 2A to 2F and 3A to 3B may be applied after dicing the wafer 30 in semiconductor chips 1. In one embodiment, the polymer layer 6 may be structured on the wafer level. If the material of the polymer layer 6 is printed onto the first face 4 of the semiconductor wafer 30, the chip contact pads 32 may not be covered with the material, that is the polymer layer 6 is directly applied in a pattern. If spin-coating is employed as the deposition method, in one embodiment, a photoresist layer may be deposited, for example, spin-coated, on top of the polymer layer 6 (not illustrated). By exposure to light having a suitable wavelength through a mask and subsequent development, openings are formed in the photoresist layer. Subsequently, if the photoresist material is of positive tone, the portions of the polymer layer 6 that are exposed by the openings may be removed by using an appropriate solvent to generate the recesses 12. If the photoresist material is of negative tone, all not exposed areas are removed by the solvent. In one embodiment, the polymer layer 6 itself may be made of a photoresist material. In this case, the recesses 12 may be directly formed in the photoresist layer 6 by exposure to light having a suitable wavelength through a mask and subsequent development. In all these cases, the remaining structured polymer layer 6 has recesses 12 which expose the chip contact pads 32 of the semiconductor wafer 30 and/or further active structures in the semiconductor wafer 30, if desired. After processing, the polymer layer 6 may be cured (heated) to reach final properties and insolubility.

After the structuring of the polymer layer 6, the material of the polymer layer 6 may be cured and thereby hardened during a heat-treatment. For this purpose the polymer layer 6 and the semiconductor wafer 30 may be exposed to an appropriate temperature. If, for example, the polymer layer 6 is made of polyimide, the temperature may be in the range from 360 to 380° C. The temperatures required for curing the material of the polymer layer 6 can be higher than the temperatures a molding compound can stand. Therefore, the polymer layer 6 may be deposited cured before the encapsulation of the semiconductor chips 1 with the mold material as described below.

As illustrated in FIG. 7C, the semiconductor wafer 30 may then be singulated into the semiconductor chips 1 (only two of the semiconductor chips 1 are illustrated in FIG. 7C), for example, by sawing, cutting, etching or laser ablation, e.g., stealth dicing. The semiconductor chip 1 illustrated in FIG. 7C is an implementation of semiconductor chip 1 shown in FIG. 4A.

In order to package the semiconductor chips 1, a carrier 50 is provided as illustrated in FIG. 7D. The carrier 50 may be a plate made of a rigid material, for example, a metal, metal alloy, silicon, glass or plastics. The carrier 50 may have at least one flat surface, and an adhesive tape 51, for example, a double sided sticky tape 51, may be laminated onto this surface of the carrier 50. Components of the semiconductor device to be fabricated can be placed on this adhesive tape 51. The shape of the carrier 50 is not limited to any geometric shape, for example, the carrier 50 may be round or square-shaped. The carrier 50 may have any appropriate size. Thus, the molded body or encapsulant 2 ("molded reconfigured wafer"), which is formed on the basis of the carrier 50, may, e.g., be disc-shaped having a diameter of, e.g., 200 or 300 mm, or may have any other shape such as a polygonal shape with the same or other lateral dimensions.

As illustrated in FIG. 7E, the semiconductor chips 1 are placed on the carrier 50. The semiconductor chips 1 can be fixed on the adhesive tape 51. Alternatively, a glue material or any other adhesive material or mechanical securing means (such as a clamping device or a vacuum generator) may be associated with the carrier 50 and used for fixing the semiconductor chips 1. The semiconductor chips 1 may be arranged in an array, wherein the spacing between neighboring semiconductor chips 1 may be determined according to the desired footprint area of the semiconductor device to be fabricated. The spacing between neighboring semiconductor chips 1 may, e.g., be in the range between 0.25 mm and 10 mm. It is to be noted that throughout FIGS. 7E to 7J, only a partial section of the carrier 50 and the encapsulant 2 (molded body) is illustrated, that is to say in practice, typically much more than two semiconductor chips 1 are placed on the carrier 50.

The semiconductor chips 1 are relocated on the carrier 50 in larger spacing as they have been in the wafer bond (FIG. 7E). The semiconductor chips 1 may have been manufactured on the same semiconductor wafer 30, but may alternatively have been manufactured on different semiconductor wafers. Furthermore, the semiconductor chips 1 may be physically identical, but may also contain different integrated circuits and/or represent other components. The semiconductor chips 1 may be arranged over the carrier 50 with their surfaces 4 containing the chip contact pads 32 facing the carrier 50. In this case the material of the polymer layer 6 may be in direct contact with the adhesive tape 51.

After the semiconductor chips 1 have been mounted on the carrier 50, they are encapsulated with an encapsulation material forming the encapsulant 2 as illustrated in FIG. 7F. The encapsulation material may cover the main surfaces 8 of the semiconductor chips 1, which are opposite to the main surfaces 4, and also the side faces 9 of the semiconductor chips 1. The gaps between the semiconductor chips 1 are also filled with the encapsulation material. For example, the encapsulation material may be a duroplastic or thermosetting mold material. The encapsulation material may be based on an epoxy material and may contain a filling material consisting of small particles of glass ($SiO_2$) or other electrically insulating mineral filler materials like $Al_2O_3$ or organic filler materials. The encapsulation material may be based on a polymer material. After curing, the encapsulation material provides stability to the array of semiconductor chips 1. Various techniques may be employed to cover the semiconductor chips 1 with the encapsulation material. The encapsulation material (mold material) may, for example, be applied by compression molding, injection molding, granulate molding, powder molding or liquid molding.

By way of example, in a compression molding process, the liquid encapsulation material is dispensed into an open lower mold half of which the carrier 50 forms the bottom. Then, after dispensing the liquid encapsulation material, an upper mold half is moved down and spreads out the liquid encapsulation material until a cavity between the carrier 50 forming the bottom of the lower mold half and the upper mold half is completely filled. This process may be accompanied by the application of heat and pressure. After curing, the encapsulation material is rigid and forms the molded body or encapsulant 2. The larger the lateral size of the molded body and the number of embedded semiconductor chips 1, the more cost efficient the process will typically be.

According to one embodiment, a polymer material is used to encapsulate the semiconductor chips 1 and to form the encapsulant 2. The polymer material may have the shape of an electrically insulating foil or sheet, which is laminated on top of the semiconductor chips 1 as well as the carrier 50. Heat and pressure may be applied for a time suitable to attach the polymer foil or sheet to the underlying structure. The gaps between the semiconductor chips 1 are also filled with the polymer material. The polymer material may, for example, be a prepreg (short for preimpregnated fibers) that is a combination of a fiber mat, for example, glass or carbon fibers, and a resin, for example, a duroplastic material. Prepreg materials are usually used to manufacture PCBs (printed circuit boards). Prepreg materials are bi-stage materials, which are flexible when applied over the semiconductor chips 1 and harden during a heat-treatment. For the lamination of the prepreg the same or similar process steps can be used as in PCB manufacturing.

The semiconductor chips 1 encapsulated in the encapsulant 2 are released from the carrier 50, and the adhesive tape 51 is pealed from the polymer layer 6 as well as from the encapsulant 2 as illustrated in FIG. 7G. The adhesive tape 51 may feature thermo-release properties, which allow the removal of the adhesive tape 51 during a heat-treatment.

After the release of the carrier 50 and the adhesive tape 51, the surface of the polymer material 6 facing away from the semiconductor chip 1 as well as the surface 3 of the encapsulant 2 form a substantially common plane 11. As mentioned before, the plane 11 may include steps (not shown in FIG. 7G) which can have a height of about up to 10 μm. In particular, a step corresponding to the stand-off of distance D shown in FIGS. 1, 2B, 3A, 4B may occur at the interfaces between the polymer layers 6 and the encapsulant 2. The plane 11 is substantially coplanar to the surfaces 4 of the semiconductor chips 1.

The surface of the substantial common plane 11 is then thinned to obtain a polished common planar surface 10 of high evenness. This process has been described in detail above and reference is made to the above description to avoid reiteration.

The conductive layer 13 is applied directly on the common planar surface 10 and is structured as illustrated in FIG. 7H. According to one embodiment, a seed layer possibly consisting of two different layers is applied. The first part of the seed layer is a barrier layer, which, for example, consists of titanium, titanium tungsten, chrome or palladium and is first deposited on the common planar surface 10 and the exposed chip contact pads 32. The deposition of the barrier layer may be carried out by electroless deposition from a solution or by sputtering. The barrier layer may have a thickness in the range from 10 to 80 nm, in particular, around 50 nm. Due to the high evenness of the common planar surface 10, adhesion of the barrier layer is improved and therefore, this process, inter alia, may be accomplished with high quality and yield.

The thickness of the seed layer may be increased by depositing a further metal layer (starting layer) onto the barrier layer. The barrier layer can be used as an electrode for a galvanic deposition of the further metal layer. The further metal layer at the top part of the seed layer may, for example, be made of copper and may have a thickness in the range from 100 to 200 nm.

A photoresist layer may be printed, electro-deposited or spin-coated on top of the seed layer (not illustrated). By exposure to light having a suitable wavelength through a mask and subsequent development or laser application, openings are formed in the photoresist layer. Subsequently, the portion of the seed layer exposed by the recesses may be reinforced by galvanic deposition of a metallic material. During the galvanic deposition of the metallic material, the seed layer is employed as an electrode. Copper or other metals or metal alloys may be plated onto the seed layer in the unmasked areas and to the desired height, which is usually greater than 3 μm.

After the plating of the conductive layer 13 the photoresist layer is stripped away by using an appropriate solvent. The now exposed portions of the original seed layer, which have not been covered with the conductive layer 13, may be removed by a brief etching step thereby creating separated conductor lines as illustrated in FIG. 7H. Other techniques for applying the conductive layer 13 may likewise be employed.

The dielectric layer 20 is then deposited on top of the conductive layer 13 and over the common planar surface 10 (FIG. 7I). The dielectric layer 20 may be deposited from a gas phase or from a solution, or can be laminated onto the surface topology. Furthermore, thin-film technology methods or a standard PCB industry process flow can be used for the application of the dielectric layer 20. The dielectric layer 20 may be fabricated from a polymer, such as polyimide, silicone, epoxy, polyurethane, acrylonitrile butadiene styrene (ABS), polybenzoxazole, benzocyclobutene (BCB), polynorbornene, phenolic resins, cyclic olefinic (co)polymers, aromatic hydrocarbons, parylene, photoresist material, duroplast, silicon nitride or an inorganic, ceramic-like material, such as silicone-carbon compounds. The thickness of the dielectric layer 20 may be up to 10 μm or even higher. The dielectric layer 20 may have the function of a solder stop layer. The dielectric layer 20 may also be omitted, e.g., if the contact pads 15 are defined by the lateral dimensions of a conductive layer 13 forming the contact pads 15 rather than by an overlying solder stop layer.

Solder deposits 28 may be placed onto the external contact pads 15 as illustrated in FIG. 7J. The solder deposits 28 may be applied to the external contact pads 15 by so-called "ball placement", in which pre-shaped balls composed of solder material are applied to the external contact pads 15. As an alternative to "ball placement", the solder deposits 28 may, for example, be applied by means of stencil printing with a solder paste, followed by a heat-treatment process. The solder material may be formed from metal alloys which are composed, for example, from the following materials: SnPb, SnAg, SnAgCu, SnAgCuNi, SnAu, SnCu and SnBi. The solder deposits 28 may be used to electrically couple the devices 300 to other components, for example, a PCB. The solder deposits 28 are electrically coupled to the chip contact pads 32 of the semiconductor chips 1 via the conductive layer 13.

As illustrated in FIG. 7K, the semiconductor devices 300 are separated from one another by separation of the encapsulant 2 and the (optional) redistribution layer 13, 20, for example, by sawing, cutting, etching or a laser beam.

It is to be noted that all embodiments of semiconductor devices 100, 200, 300 may feature improved TCoB (Temperature Cycling on Board) reliability, because the polymer layer 6 reduces the warpage of the molded body (encapsulant 2). This effect is caused by a reduction of the difference between the CTE (Coefficient of Thermal Expansion) of the backside surface of the molded body and the CTE of the front side surface of the molded body, because both surfaces are formed of materials having similar CTE (in contrast to the situation in FIG. 1, where the surfaces 4 of semiconductor material form parts of the front side surface of the molded body, whereas the backside surface of the molded body is typically completely formed by the material of the encapsulant 2).

It is obvious to a person skilled in the art that the device 300 shown in FIG. 7K and the manufacturing thereof as described above are only intended to be an exemplary embodiment, and many variations are possible. Each of the devices 300 described above contains a single semiconductor chip. Alternatively, two or more semiconductor chips or passive devices of different types may be included in the same device 300. The semiconductor chips and passive devices may differ in function, size, manufacturing technology etc. Furthermore, the redistribution structure 13, 20 may contain more than one metal layer. The metal layers may be stacked on top of each other, and dielectric layers may be arranged between adjacent metal layers.

Further, a conductive redistribution structure (not shown) on the backside main surface of the encapsulant 2 may be generated the same way as the conductive redistribution structure 13, 20 on the front side main surface 3. Similar to the front side main surface 3, the backside main surface of the encapsulant 2 may be made planar by a thinning (e.g., CMP) operation. The conductive redistribution structure on the backside of the encapsulant 2 may have one of the designs as the conductive redistribution structure 13, 20.

Further, the semiconductor chips 1 may have chip contact pads on the chip surface 8 facing away from the carrier 50. If the semiconductor chips 1 are power transistors, the chip contact pads 32 may include a source terminal and a gate terminal. In other cases, e.g., if the semiconductor chip 1 is a power diode, only one contact pad (e.g., the anode terminal) may be provided on the chip surface 4.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor chip having a first main chip surface and a second main chip surface;
a polymer layer arranged over the first main chip surface; and
an encapsulant made of molding material accommodating the semiconductor chip, the encapsulant having a first mold surface and a second mold surface, wherein
the first mold surface and a surface of the polymer layer facing away from the semiconductor chip form a common planar surface, wherein the polymer layer comprises a photosensitive material.

2. A semiconductor device comprising:
a semiconductor chip having a first main chip surface and a second main chip surface;
a polymer layer arranged over the first main chip surface; and
an encapsulant made of molding material accommodating the semiconductor chip, the encapsulant having a first mold surface and a second mold surface, wherein the first mold surface and a surface of the polymer layer facing away from the semiconductor chip form a common planar surface, wherein the encapsulant comprises an epoxy material.

3. A semiconductor device comprising:
a semiconductor chip having a first main chip surface and a second main chip surface;
a polymer layer arranged over the first main chip surface; and
an encapsulant made of molding material accommodating the semiconductor chip, the encapsulant having a first mold surface and a second mold surface, wherein the first mold surface and a surface of the polymer layer facing away from the semiconductor chip form a common planar surface, wherein the common planar surface has maximum step-like height variations of less than 1000 nm.

4. The semiconductor device of claim 1, further comprising a layer of conductive material overlying the common planar surface.

5. The semiconductor device of claim 4, wherein the layer of conductive material is electrically connected to a contact pad on the semiconductor chip through an opening in the polymer layer.

6. The semiconductor device of claim 4, further comprising a layer of insulating material overlying the layer of conductive material.

7. The semiconductor device of claim 6, wherein the layer of insulating material comprises openings configured as solder stops.

8. The semiconductor device of claim 4, further comprising solder depots attached to the layer of conductive material.

9. The semiconductor device of claim 1 wherein the polymer layer is filled with a filler material, comprising mineral or organic particles.

10. A sheet-like multichip arrangement, comprising:
an array of semiconductor chips, each semiconductor chip having a first main chip surface and a second main chip surface;
polymer layers arranged over the first main chip surfaces; and
an encapsulant made of molding material accommodating the semiconductor chips, the encapsulant having a first mold surface and a second mold surface, wherein the first mold surface and surfaces of the polymer layers facing away from the semiconductor chips form a common planar surface of the multichip arrangement, wherein the common planar surface of the multichip arrangement has step-like height variations.

11. The sheet-like multichip arrangement of claim 10, the common planar surface of the multichip arrangement has maximum step-like height variations of less than 1000 nm.

12. A semiconductor device, comprising:
a semiconductor chip having a first main chip surface and a second main chip surface;
a polymer layer arranged over the first main chip surface; and
an encapsulant made of molding material accommodating the semiconductor chip, the encapsulant having a first mold surface and a second mold surface, wherein the first mold surface and a surface of the polymer layer facing away from the semiconductor chip form a common planar surface, wherein the polymer layer is filled with a filler material comprising mineral or organic particles.

13. The semiconductor device of claim 12, further comprising a layer of conductive material overlying the common planar surface.

14. The semiconductor device of claim 13, wherein the layer of conductive material is electrically connected to a contact pad on the semiconductor chip through an opening in the polymer layer.

15. The semiconductor device of claim 13, further comprising a layer of insulating material overlying the layer of conductive material.

16. The semiconductor device of claim 15, wherein the layer of insulating material comprises openings configured as solder stops.

17. The semiconductor device of claim 13, further comprising solder depots attached to the layer of conductive material.

18. The semiconductor device of claim 12, wherein the common planar surface has step-like height variations.

19. The semiconductor device of claim 12, wherein the common planar surface has maximum step-like height variations of less than 1000 nm.

* * * * *